United States Patent
Osumi

(10) Patent No.: US 12,290,899 B2
(45) Date of Patent: May 6, 2025

(54) METHOD OF MANUFACTURING GALLIUM NITRIDE SINGLE-CRYSTAL SUBSTRATE AND METHOD OF MANUFACTURING SINGLE-CRYSTAL SUBSTRATE OF NITRIDE OF GROUP 13 ELEMENT IN PERIODIC TABLE

(71) Applicant: KYOCERA Corporation, Kyoto (JP)

(72) Inventor: Yuri Osumi, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/575,243

(22) PCT Filed: Jun. 30, 2021

(86) PCT No.: PCT/JP2021/024722
§ 371 (c)(1),
(2) Date: Dec. 28, 2023

(87) PCT Pub. No.: WO2023/276036
PCT Pub. Date: Jan. 5, 2023

(65) Prior Publication Data
US 2024/0300064 A1    Sep. 12, 2024

(51) Int. Cl.
*B24B 7/22* (2006.01)
*C30B 29/40* (2006.01)
*C30B 33/00* (2006.01)

(52) U.S. Cl.
CPC .............. *B24B 7/228* (2013.01); *B24B 7/22* (2013.01); *C30B 29/406* (2013.01); *C30B 33/00* (2013.01)

(58) Field of Classification Search
CPC ......... B24B 7/228; B24B 7/22; C30B 29/406; C30B 33/00
See application file for complete search history.

(56) References Cited

U.S. PATENT DOCUMENTS

| | | | |
|---|---|---|---|
| 2008/0308815 A1* | 12/2008 | Kasai | C30B 25/04 257/E21.124 |
| 2009/0298265 A1 | 12/2009 | Fujiwara | |

(Continued)

FOREIGN PATENT DOCUMENTS

| | | |
|---|---|---|
| JP | 2002-158377 A | 5/2002 |
| JP | 2009-286652 A | 12/2009 |

(Continued)

OTHER PUBLICATIONS

International Search Report for the corresponding PCT Application No. PCT/JP2021/024722 dated Sep. 7, 2021, 2 pages.

(Continued)

*Primary Examiner* — Nathan W Ha
(74) *Attorney, Agent, or Firm* — Procopio, Cory, Hargreaves & Savitch LLP

(57) ABSTRACT

A method of manufacturing a gallium nitride single-crystal substrate includes a step of grinding a main surface by arranging a grindstone and a gallium nitride single crystal having a semipolar plane or a nonpolar plane as the main surface to face each other and pressing the grindstone and the gallium nitride single crystal against each other while moving the grindstone and the gallium nitride single crystal relative to each other. The main surface is ground to make an angle formed by a direction in which the grindstone grinds the main surface and a direction obtained by projecting a c-axis of the gallium nitride single crystal onto the main surface within at least one range selected from (A) -45° or more and 45° or less; (B) 55° or more and 135° or less; and (C) -135° or more and -55° or less.

13 Claims, 8 Drawing Sheets

(56) References Cited

U.S. PATENT DOCUMENTS

| | | | | |
|---|---|---|---|---|
| 2011/0068434 | A1* | 3/2011 | Yamaguchi | H01L 21/02021 |
| | | | | 83/13 |
| 2011/0201184 | A1* | 8/2011 | Motoki | C30B 25/02 |
| | | | | 438/492 |
| 2011/0215440 | A1 | 9/2011 | Fujiwara | |
| 2013/0020585 | A1* | 1/2013 | Ishibashi | H01L 29/868 |
| | | | | 438/510 |
| 2013/0072005 | A1* | 3/2013 | Fujikura | C30B 33/00 |
| | | | | 257/E21.097 |
| 2013/0252401 | A1* | 9/2013 | Yamaguchi | C30B 33/00 |
| | | | | 438/460 |
| 2016/0319460 | A1* | 11/2016 | Tsukada | H01L 21/0254 |
| 2017/0137966 | A1* | 5/2017 | Kiyama | C30B 29/64 |
| 2017/0221697 | A1* | 8/2017 | Sasaki | H01L 21/02529 |
| 2017/0256391 | A1* | 9/2017 | Okita | H01L 21/02013 |
| 2017/0338112 | A1* | 11/2017 | Iso | C30B 25/18 |
| 2019/0189438 | A1* | 6/2019 | Mikawa | H01L 21/02389 |
| 2021/0164127 | A1* | 6/2021 | Iso | H01L 29/36 |
| 2021/0254241 | A1* | 8/2021 | Kamikawa | H01L 33/0075 |
| 2021/0292931 | A1* | 9/2021 | Yoshida | H01L 21/0242 |

FOREIGN PATENT DOCUMENTS

| | | |
|---|---|---|
| JP | 2011-71180 A | 4/2011 |
| JP | 2013-123763 A | 6/2013 |
| JP | 2013-211491 A | 10/2013 |

OTHER PUBLICATIONS

Decision to Grant a Patent for the corresponding JP Application No. 2021-564899 dated Sep. 6, 2022, 5 pages.

Written Opinion of the International Searching Authority for the corresponding PCT Application No. PCT/JP2021/024722 dated Sep. 7, 2021, 6 pages.

International Preliminary Report on Patentability for the corresponding PCT Application No. PCT/JP2021/024722 dated Sep. 7, 2021, 4 pages.

* cited by examiner

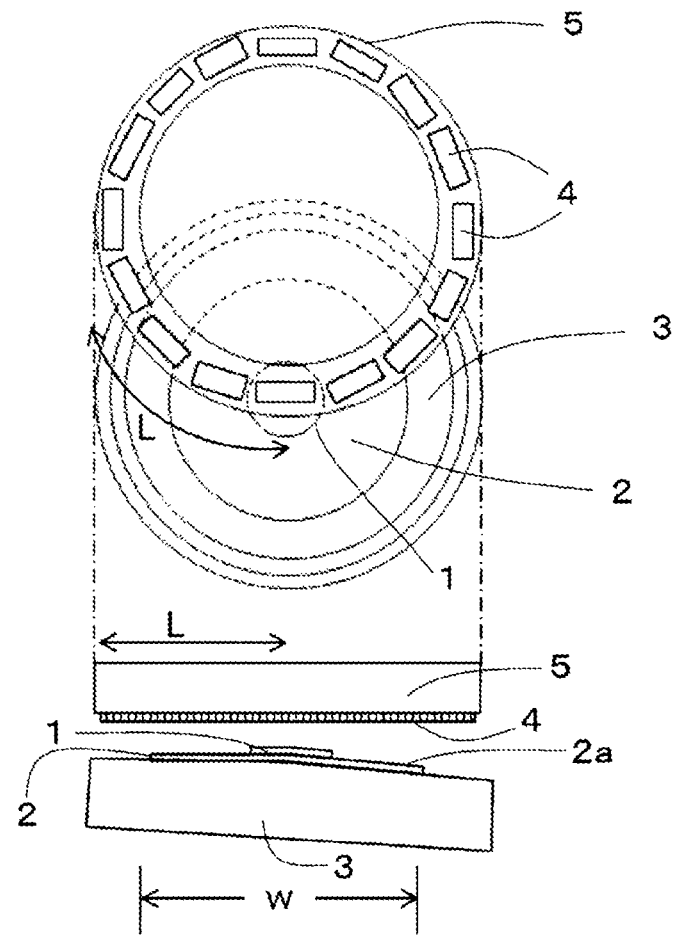
FIG. 4A
FIG. 4B
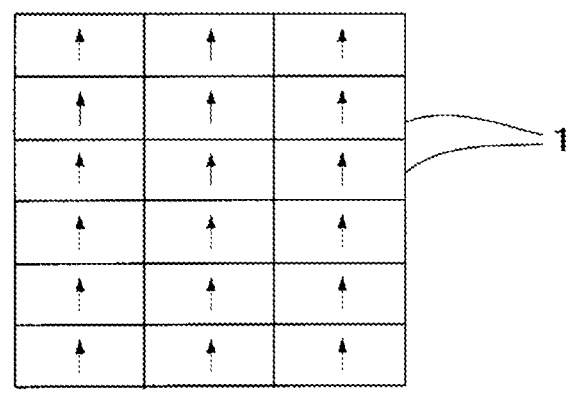
FIG. 5

METHOD OF MANUFACTURING GALLIUM NITRIDE SINGLE-CRYSTAL SUBSTRATE AND METHOD OF MANUFACTURING SINGLE-CRYSTAL SUBSTRATE OF NITRIDE OF GROUP 13 ELEMENT IN PERIODIC TABLE

TECHNICAL FIELD

The present disclosure relates to a method of manufacturing a gallium nitride single-crystal substrate and a method of manufacturing a single-crystal substrate of a nitride of an element of group 13 in the periodic table.

BACKGROUND OF INVENTION

A crystal including a nitride of an element of group 13 in the periodic table represented by gallium nitride (GaN) has excellent semiconductor characteristics such as a band gap and a dielectric breakdown field. Therefore, such a nitride crystal is useful in light-emitting devices such as light-emitting diodes and laser diodes, electronic devices having a high frequency and high output, and the like.

The crystal including a nitride of an element of group 13 in the periodic table has a hexagonal crystal structure and is polarized in the c-axis direction. In the related art, gallium nitride crystals having a polar plane (c-plane) as a main surface are used in gallium nitride light-emitting diodes (LEDs). However, a phenomenon (droop phenomenon) has been recognized in which electrons and holes are separated by an internal electric field caused by the polarity and the light emission efficiency is reduced. Therefore, devices such as LEDs using a gallium nitride crystal having a semipolar plane or a nonpolar plane as a main surface are being developed. The gallium nitride crystal has anisotropy in workability due to the polarity, and the workability is different between the Ga-face and the N-face of a c-plane gallium nitride crystal. Documents of the related art describing a grinding process of a gallium nitride crystal include Patent Document 1, but a method of machining a semipolar plane and a nonpolar plane is not well known.

CITATION LIST

Patent Literature

Patent Document 1: JP 2013-211491 A

SUMMARY

The present inventors have found that the influence of the polarity of the gallium nitride single crystal also appears when machining a semipolar plane and a nonpolar plane. The present inventors studied a relationship between crystal orientation, grinding direction, and workability, which led to the completion of the following manufacturing method.

That is, a method of manufacturing a gallium nitride single-crystal substrate according to the present disclosure includes a step of grinding a main surface by arranging a single-crystal holder holding a gallium nitride single crystal having a semipolar plane as the main surface and a grindstone holder holding a grindstone to face each other, and pressing the gallium nitride single crystal and the grindstone against each other while rotating one or both of the gallium nitride single crystal and the grindstone, and the main surface is ground to make an angle formed by a direction in which the grindstone grinds the main surface and a direction obtained by projecting a c-axis of the gallium nitride single crystal onto the main surface be within at least one range selected from the group consisting of ranges A, C, and E below.

Range A: −45° or more and 45° or less
Range C: 55° or more and 135° or less
Range E: −135° or more and −55° or less (where the angle is formed by a direction obtained by projecting a [0001] direction of the gallium nitride single crystal onto the main surface when the main surface is a surface on a [0001] direction side, or a direction obtained by projecting a [000-1] direction of the gallium nitride single crystal onto the main surface when the main surface is a surface on a [000-1] direction side, and a direction in which the grindstone grinds the main surface; an upstream side of the substrate in a rotation direction being from 0° to 180°; and a downstream side being from 0° to −180°)

A method of manufacturing a single-crystal substrate of a nitride of an element of group 13 in the periodic table according to the present disclosure includes a step of grinding a main surface by arranging a grindstone and a single crystal of a nitride of an element of group 13 in the periodic table having a semipolar plane as the main surface to face each other, and pressing the single crystal and the grindstone against each other while reciprocating the single crystal and the grindstone relative to each other in a direction substantially orthogonal to a direction obtained by projecting a [000-1] direction of the single crystal onto the main surface.

Another method of manufacturing a single-crystal substrate of a nitride of an element of group 13 in the periodic table according to the present disclosure includes a step of grinding a main surface by arranging a grindstone and a single crystal of a nitride of an element of group 13 in the periodic table having a semipolar plane as the main surface to face each other, and pressing the grindstone and the single crystal against each other while relatively moving the grindstone in a direction substantially identical to a direction obtained by projecting a [0001] direction of the single crystal onto the main surface when the main surface is a surface on a [0001] direction side, or in a direction substantially identical to a direction obtained by projecting a [000-1] direction of the single crystal onto the main surface when the main surface is a surface on a [000-1] direction side.

Another method of manufacturing a gallium nitride single-crystal substrate according to the present disclosure includes a step of grinding a main surface by arranging a single-crystal holder holding a gallium nitride single crystal having a nonpolar plane as the main surface and a grindstone holder holding a grindstone to face each other, and pressing the gallium nitride single crystal and the grindstone against each other while rotating one or both of the gallium nitride single crystal and the grindstone, and the gallium nitride single crystal is held and ground to make a direction in which the grindstone grinds the main surface be within one or both of ranges G and I below, or within one or both of ranges H and J.

Range G: −45° or more and 45° or less
Range H: 45° or more and 135° or less
Range I: 135° or more and 180° or less and −180° or more and −135° or less
Range J: −135° or more and −45° or less (where the angle is formed by a direction obtained by projecting a [000-1] direction of the gallium nitride single crystal onto the main surface, and a direction in which the grindstone grinds the main surface; an upstream side of the substrate in a rotation direction being from 0° to 180°; and a downstream side being from 0° to −180°)

BRIEF DESCRIPTION OF THE DRAWINGS

FIG. 4A is a plan view generally illustrating a positional relationship between a single-crystal holder and a grindstone holder having a wheel shape in the surface grinding step, and FIG. 4B is a side view thereof.

FIG. 5 is an explanatory view illustrating an example of an attached state of a plurality of gallium nitride single crystals.

DESCRIPTION OF EMBODIMENTS

Figure 1:
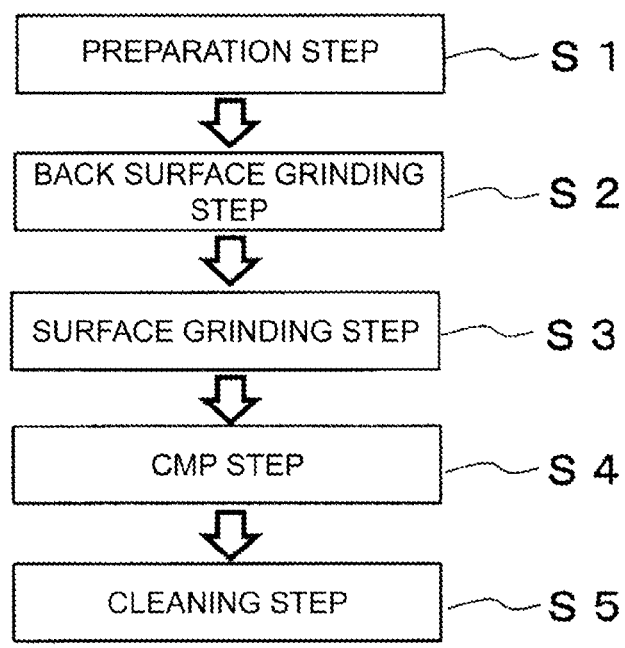
FIG. 1 is a flowchart illustrating a method of manufacturing a gallium nitride single-crystal substrate according to an embodiment of the present disclosure.

A method of manufacturing a gallium nitride substrate according to an embodiment of the present disclosure will be described below with reference to the drawings. FIG. 1 is a flowchart illustrating an overview of the method of manufacturing a gallium nitride single-crystal substrate according to an embodiment of the present disclosure.

As illustrated in FIG. 1, in a preparation step S1, first, a gallium nitride single crystal 1 having a plate shape (may simply be referred to as a single crystal 1 hereinafter) is prepared. For example, by a slicing step of slicing a gallium nitride single-crystal ingot produced by a vapor phase growth method with, for example, a wire saw or the like, the gallium nitride single crystal 1 having a plate shape and having a main surface in a specific orientation can be obtained. Before or after the slicing step, an outer shape machining step of machining a profile shape of the single crystal 1 into a desired shape may be performed.

Figure 2A:
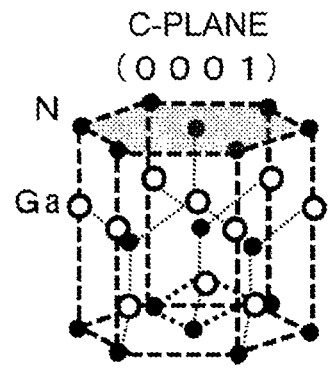
FIGS. 2A to 2C are schematic views for explaining a polar plane, a semipolar plane, and a nonpolar plane of a gallium nitride single crystal.
Figure 2B:
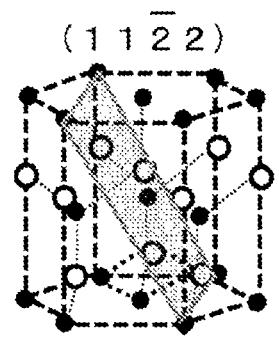
Figure 2C:
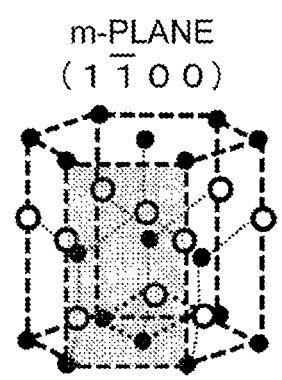

In the present disclosure, the gallium nitride single crystal 1 having a semipolar plane or a nonpolar plane as a main surface is used. FIGS. 2A to 2C illustrate a polar plane, a semipolar plane, and a nonpolar plane of a gallium nitride single crystal.

In a gallium nitride single crystal, a growth technique is established for a single crystal having a polar plane (c-plane, {0001} plane) as a main surface, as illustrated in FIG. 2A, and thus, this plane is generally used. On the other hand, in a gallium nitride single crystal having an m-plane ({1-100} plane) as the main surface, as illustrated in FIG. 2C, a plane perpendicular to the polar plane is a nonpolar plane. In gallium nitride single crystals having a {11-22} plane, a {11-21} plane, a {11-23} plane, a {30-31} plane, a {20-21} plane, a {10-11} plane, or a {10-12} plane as the main surface, such as illustrated in FIG. 2B, an intermediate plane between the polar plane and the nonpolar plane is a semipolar plane. A gallium nitride single-crystal substrate having a semipolar plane or a nonpolar plane as a main surface is expected to be applied to a light emitting element having high efficiency and high output.

In the notation of the Miller indices, ( ) represents a specific plane, { } represent an equivalent plane, [ ] represents a specific direction, and < > represents an equivalent direction. Note that an orientation having a negative value is generally represented by adding a bar above the number. However, in the present specification, an orientation having a negative value is represented by a minus sign (−) for convenience. For example, the {0001} plane includes the (0001) plane and the (000-1) plane. The {20-21} plane includes the (20-21) plane, the (20-2-1) plane, and planes equivalent to the (20-21) plane and the (20-2-1) plane.

In the slicing step, for example, a gallium nitride single crystal grown in the c-plane is sliced diagonally in the c-plane (so that the main surface is inclined with respect to both the polar plane and the nonpolar plane), and thus, the gallium nitride single crystal 1 having a plate shape and having a semipolar plane as the main surface can be cut out. On the other hand, by slicing perpendicularly to the c-plane, the gallium nitride single crystal 1 having a plate shape and having a nonpolar plane as the main surface can be cut out.

In particular, when the orientation of the main surface is inclined from the nonpolar plane toward the c-plane at an angle of more than 0° and 45° or less, a main surface having relatively low polarity can be obtained, which is preferable. If the inclination from the nonpolar plane increases, the anisotropy of the machining characteristics is more pronounced. The present embodiment is particularly suitable for the gallium nitride single crystal 1 in which the orientation of the main surface is inclined from the nonpolar plane toward the c-plane by 2° or more, and more preferably, by 5° or more. In the gallium nitride single crystal 1 in which the orientation of the main surface is inclined by less than 2° from the nonpolar plane toward the c-plane, a nonpolar plane machining method described later may be applied.

The single crystal 1 having a plate shape that is cut out in the slicing step may be machined to be formed into a desired outer shape by dicing or the like. The profile shape (planar shape) of the obtained single crystal 1 is not particularly limited and may be a circular shape or a polygonal shape. The size of the single crystal 1 is not particularly limited, as long as the single crystal 1 has a plate shape (has a thickness that is relatively small with respect to the dimensions of the plane).

Thus, the preparation step S1 is completed, and next, a back surface grinding step S2 illustrated in FIG. 1 is performed. The back surface grinding step S2 is performed mainly for the purpose of machining the single crystal 1 to a desired thickness, forming the back surface into a flat surface, and controlling the surface roughness. Specifically, the front surface of the single crystal 1 is preferably attached to a base, and the back surface is ground by using, for example, lapping, grinding with a grindstone, or the like.

Crystal defects, residual stress, and the like generated by the grinding may be removed by etching.

Figure 3A:
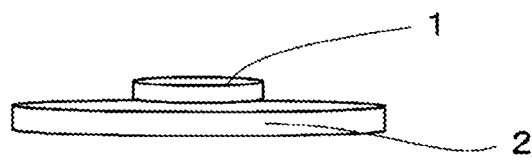
FIGS. 3A to 3D are schematic views illustrating a surface grinding step for the gallium nitride single crystal.

Next, a surface grinding step S3 is performed. The surface grinding step S3 is illustrated in FIGS. 3A to 3D. A vertical shaft round table grinding apparatus as illustrated in FIG. 4 may be used as a grinding apparatus. In the vertical shaft round table grinding apparatus, a rotation axis of a chuck table 3 on which the single crystal 1 is placed is parallel to a rotation axis of a grindstone holder 5 holding a grindstone 4. First, as illustrated in FIG. 3A, the gallium nitride single crystal 1 is attached to and held on a surface of a single-crystal holder 2. In order to increase productivity, a plate-shaped body having a surface area larger than that of the single crystal 1 is preferably used as the single-crystal holder 2 and a plurality of slices of the gallium nitride single crystal 1, for example, three to ten-odd slices of the gallium nitride single crystal 1 are preferably held on the surface of the single-crystal holder 2.

For example, the single-crystal holder 2 may be a silicon substrate, an alumina ($Al_2O_3$) substrate, a sapphire (single-crystal alumina) substrate, a silicon carbide (SiC) substrate, or the like. In order to attach the gallium nitride single crystal 1 onto the single-crystal holder 2, for example, wax, an adhesive such as an epoxy-based adhesive, or a double-sided adhesive tape (an adhesive tape having an adhesive agent on both sides) may be used. When a dummy (template) to be ground together with the gallium nitride single crystal 1 is arranged in the periphery of the gallium nitride single crystal 1, an end portion can have improved machining accuracy. The material of the dummy is, for example, GaN, glass fiber reinforced plastic, carbon fiber reinforced plastic, silicon, sapphire, SiC, or the like.

Figure 3B:
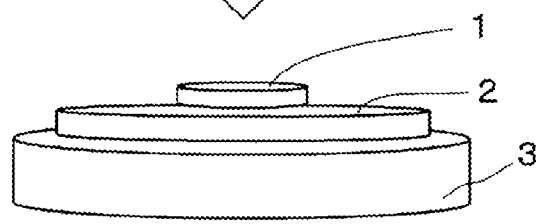

Next, as illustrated in FIG. 3B, the single-crystal holder 2 to which the gallium nitride single crystal 1 is attached is placed on the chuck table 3. The chuck table 3 has a surface having a porous structure and utilizes negative pressure to hold the single-crystal holder 2 as a flat surface. The chuck table 3 is rotatable about a central axis thereof by a rotational drive source (not illustrated). Note that the gallium nitride single crystal 1 may be directly held by the chuck table 3, without using the single-crystal holder 2.

The grindstone 4 (see FIG. 4) for grinding the gallium nitride single crystal 1 is formed in a rectangular shape, for example, and is held by the grindstone holder 5 having a wheel shape. In this case, a plurality of grindstones 4 are preferably arrayed at equal intervals in a circular shape along a circumferential direction of the grindstone holder 5. If the grindstone 4 has a shape including a major axis and a minor axis, the major axis may be arranged in the circumferential direction and the minor axis may be arranged in a radial direction. A diameter of a trajectory (pitch circle diameter) of the grindstone 4 is larger than or equal to a width w (diameter) of the single-crystal holder 2. The grindstone 4 may have a shape that is curved at a curvature corresponding to the trajectory of the grindstone 4. The trajectory of the grindstone 4 is curved. Thus, the smaller the width of an arrangement region of the single crystal 1 (a length intersecting the trajectory of the grindstone 4, or one width when the arrangement region is annular and intersects the trajectory of the grindstone 4 at two locations) relative to the diameter of the trajectory of the grindstone 4, the easier it is to control the grinding direction of the grindstone 4 with respect to each of the single crystals 1. For example, the width of the arrangement region of the single crystal 1 may be equal to or less than half the diameter of the trajectory of the grindstone 4. The width of each of the single crystals 1 (the length intersecting the trajectory of the grindstone 4) may be equal to or less than half the diameter of the trajectory of the grindstone 4. When a plurality of the single crystals 1 are arranged in a radial direction of the single-crystal holder 2, the orientation of the single crystals 1 on the inner side and the single crystals 1 on the outer side may be adjusted in accordance with the trajectory of the grindstone 4.

For example, a diamond grindstone, a SiC grindstone, or the like can be used as the grindstone 4. Abrasive grains of the grindstone 4 are not particularly limited, as long as the abrasive grains are capable of grinding the gallium nitride single crystal 1, but preferably, abrasive grains having a grit from #1000 to #5000 are used. The gallium nitride single crystal 1 may be ground first by the grindstone 4 having a low grit (#1000 to #5000) and a relatively large grain size, and then, by the grindstone 4 having a high grit (for example, #6000 or more) and a relatively small grain size.

Figure 3C:
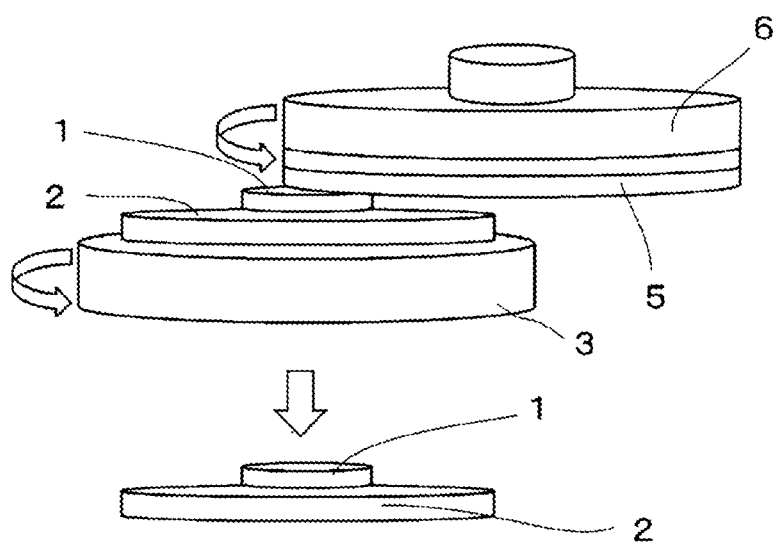

As illustrated in FIG. 3C, the grindstone holder 5 is fixed to a tip end portion of a spindle 6, and the grindstone holder 5 is rotated in the circumferential direction by the rotation of the spindle 6.

During the grinding of the gallium nitride single crystal 1, the single-crystal holder 2 and the grindstone holder 5 are arranged to face each other (see FIGS. 3C, 4A, and 4B). The gallium nitride single crystal 1 and the grindstone 4 are pressed against each other at a predetermined pressure while being rotated to grind the main surface of the gallium nitride single crystal 1. In FIGS. 4A and 4B, a positional relationship between the single-crystal holder 2 and the grindstone holder 5 is adjusted so that the single crystal 1 is held near the center of the single-crystal holder 2 and the grindstone 4 passes near the center of the single crystal 1.

As illustrated in FIGS. 3C and 4A, the single-crystal holder 2 and the grindstone holder 5 rotate in the same direction, but the single-crystal holder 2 and the grindstone holder 5 may rotate in opposite directions.

The rotation speed of the chuck table 3 holding the single-crystal holder 2 is preferably 50 rpm or more and 300 rpm or less. The rotation speed (peripheral speed) of the grindstone 4 is preferably 10 m/s or more and 30 m/s or less. The feed speed of the grindstone 4 in a thickness direction of the single crystal 1 is preferably 0.05 μm/s or more and 1.0 μm/s or less.

Figure 3D:
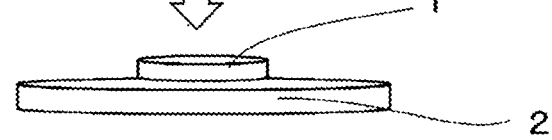

After the grinding is completed, the single-crystal holder 2 is removed from the chuck table 3, as illustrated in FIG. 3D.

As illustrated in FIG. 4B, a surface 2a of the chuck table 3 holding the gallium nitride single crystal 1 illustrated in FIG. 4B may be inclined with a center portion as a vertex. The single-crystal holder 2 and the single crystal 1 may be deformed to follow the shape of the chuck table 3 to limit a grinding region. If the grinding region of the grindstone 4 is limited to about half the region of the single-crystal holder 2, the grinding can have improved workability while the burden on the apparatus and the jig is reduced. In FIGS. 4A and 4B, the grinding region is indicated by an arrow L. By limiting a machining region, the grinding speed, and the grinding direction of the grindstone 4 with respect to the main surface of the single crystal 1 are also limited.

The present inventors have found that, in the grinding of the gallium nitride single crystal 1 having a nonpolar plane or a semipolar plane as a main surface, the workability varies depending on an incident direction (angle) of the grindstone 4 and the surface roughness varies. For example, as illustrated in FIG. 5, a case is described in which 18 of the gallium nitride single crystals 1 each having a semipolar plane as a main surface are attached to the surface of the single-crystal holder 2. The gallium nitride single crystals 1 each having a semipolar plane as a main surface include a main surface on the direction side and a main surface on the [000-1] direction side. Below, a case in which the main surface on the [000-1] direction side is ground will be described. In FIG. 5, arrows indicate directions obtained by projecting the [0001] direction (a direction of the gallium plane) of the gallium nitride single crystals 1 onto the main surface. An upper side (the direction of the arrow) of each of the single crystals 1 is a side close to the gallium plane, and a lower side is a side close to the nitrogen plane.

Figure 6:
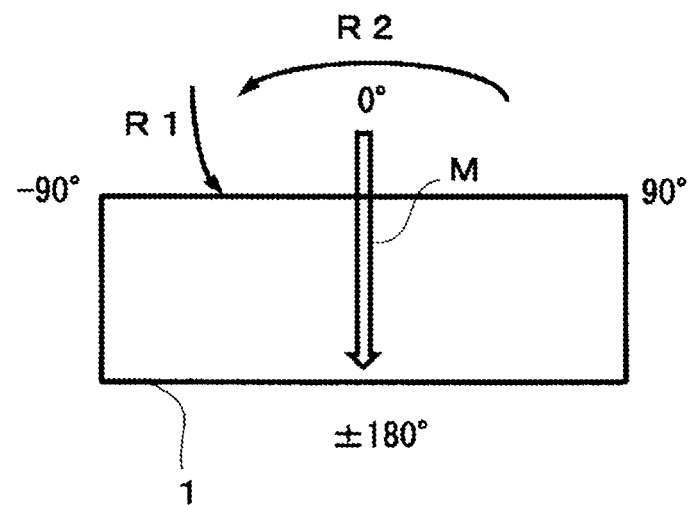
FIG. 6 is a schematic view for explaining the determination of a range to be ground in the surface grinding step.

As illustrated in FIG. 6, the grinding direction of the grindstone 4 is represented by an angle between a direction M and a direction R1. The direction M is obtained by projecting the [000-1] direction of the gallium nitride single crystal 1 onto the main surface. The direction R1 is a direction in which the grindstone 4 grinds the main surface in accordance with the rotation of the single-crystal holder 2 and the grindstone holder 5. In FIG. 6, the angle being formed is from 0° to 180° on an upstream side and from 0° to −180° on a downstream side of the gallium nitride single crystal 1 in a rotation direction R2.

Figure 7:
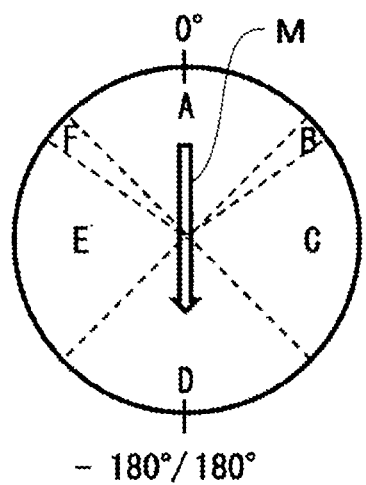
FIG. 7 is an explanatory view illustrating ranges A to F to be ground in the surface grinding step.
Figure 8A:
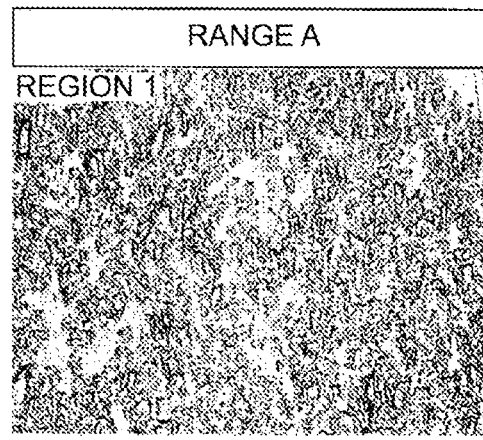
FIG. 8A is a photomicrograph of a substrate surface ground in the range A.
Figure 8B:
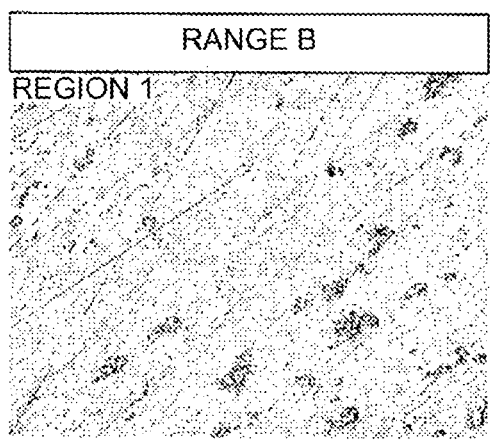
FIG. 8B is a photomicrograph of a substrate surface ground in the range B.
Figure 8C:
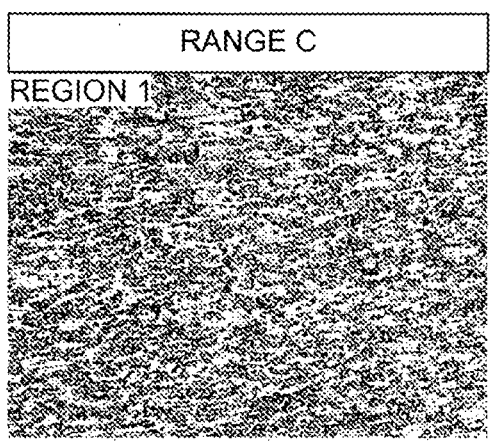
FIG. 8C is a photomicrograph of a substrate surface ground in the range C.
Figure 8D:
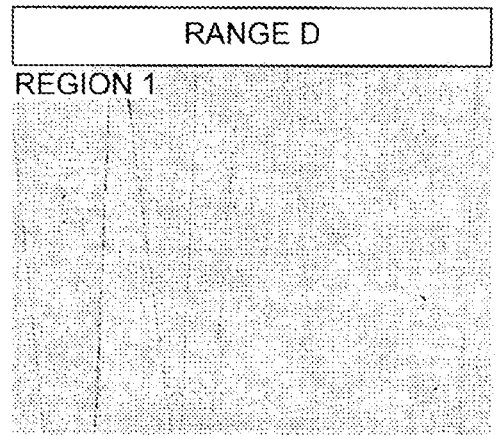
FIG. 8D is a photomicrograph of a substrate surface ground in the range D.
Figure 8E:
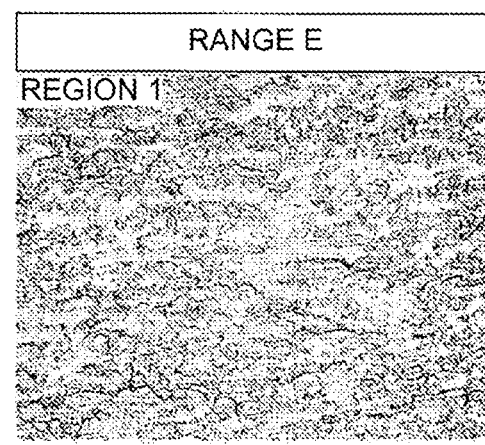
FIG. 8E is a photomicrograph of a substrate surface ground in the range E.
Figure 8F:
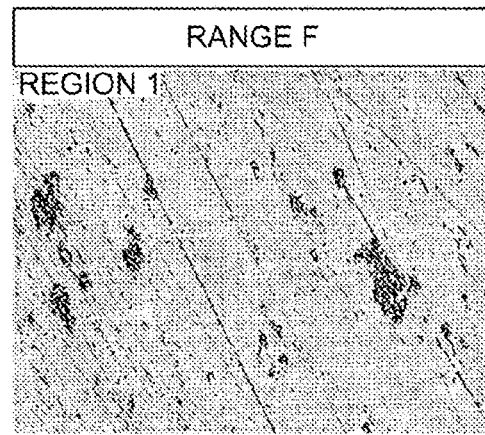
FIG. 8F is a photomicrograph of a substrate surface ground in the range F.

The present inventors have found that, when the (20-2-1) plane (main surface on the [000-1] direction side) of the gallium nitride single crystal 1 that is semipolar and has main surfaces (front and back surfaces) in the (20-21) plane and the (20-2-1) plane is ground under such conditions, the surface roughness of the gallium nitride single crystal 1 differs depending on the ranges in which the gallium nitride single crystal 1 is arranged (the surface roughness changes at the boundaries of each range). That is, when the surface roughness of each of the gallium nitride single crystals 1 is examined after grinding, it is found that the surface roughness can be classified into ranges A to F illustrated in FIG. 7. Each range is represented by an angle formed by the direction M and the direction R1. The direction M is obtained by projecting the [000-1] direction of the gallium nitride single crystal 1 onto the main surface. The direction R1 is a direction in which the grindstone 4 grinds the main surface. The upstream side of the single crystal 1 in the rotation direction is from 0° to 180°, and the downstream side is from 0° to −180°. The grinding direction of the grindstone 4 is determined from a grinding mark (a path of the grindstone 4) formed on the main surface.

The surfaces of the gallium nitride single crystals 1 after grinding are illustrated in FIGS. 8A to 8F for each range. The surface roughness for each range is shown in Table 1.

TABLE 1

| Range of angles | | Arithmetic average height Sa (nm) | Thickness T (μm) |
| --- | --- | --- | --- |
| A | −45° to 0° to 45° | 385 | 1315 |
| B | More than 45° and less than 55° | 58 | 1316 |
| C | 55° to 135° | 229 | 1315 |
| D | More than 135° and 180° or less and −180° or more and less than −135° | 14 | 1317 |
| E | −135° to −55° | 216 | 1315 |
| F | More than −55° and less than −45° | 51 | 1316 |

The specific machining conditions used to obtain the surface roughness (arithmetic average height Sa) shown in Table 1 are as follows. The rotation speed of the chuck table 3 is 100 rpm, a #3000 diamond grindstone is used as the grindstone 4, the rotation speed (peripheral speed) of the grindstone 4 is 19 m/s, and the feed speed of the grindstone 4 is 0.12 μm/s or less.

For example, the arithmetic average height Sa can be determined by using a laser microscope VK-X1100 manufactured by KEYENCE CORPORATION. For example, the measurement mode is set to color ultra-deep. The measurement multiplication factor is set to 1200 times (objective 50 times, eyepiece 24 times). The measurement range is set to about 60 μm×80 μm. A measurement pitch, a cutoff filter λs, and a cutoff filter λc are appropriately set in accordance with the surface shape of the measurement region. The arithmetic average height is measured at a plurality of locations (five or more points), and an average value thereof is used as a measurement value. A thickness T of the single crystal 1 can be determined by using a micrometer.

As can be seen from FIGS. 8A to 8F and Table 1, the arithmetic average height Sa of the gallium nitride single crystal 1 is larger in the ranges A, C, and E than in the other ranges B, D, and F. That is, in the ranges B, D, and F, the main surface is close to a mirror surface, whereas in the ranges A, C, and E, the arithmetic average height Sa is 0.2 μm or more and the main surface is a so-called satin-finished surface. It can also be seen that the thickness T of the gallium nitride single crystal 1 is smaller (the grinding amount is larger) in the ranges A, C, and E than in the other ranges B, D, and F.

The surface ground by the grindstone 4 of #3000 is generally a satin-finished surface. In the ranges A, C, and E, the arithmetic average height (Sa) of the main surface of the single crystal 1 ground by the grindstone 4 is 0.2 μm or more, which indicates that the grinding is properly performed. On the other hand, in the ranges B, D, and F, the arithmetic average height (Sa) of the main surface of the single crystal 1 ground by the grindstone 4 is less than 0.2 μm, which indicates that the grinding is not properly performed (that is, the grinding is a polishing process despite using a grindstone for grinding). In these ranges, it is expected that a relatively large residual stress is generated on a machined surface, because grinding is not properly performed. In the ranges A, C, and E, surface states of the machined surfaces are relatively uniform (see FIGS. 8A, 8C, and 8E). In the present disclosure, the grinding marks on the main surface of the single crystal 1 are formed by a plurality of arcs, and the grinding direction of the grindstone 4 varies within the main surface of the single crystal 1. In such a case, the grinding direction of the grindstone 4 in the entire region of the main surface (that is, all grinding marks) is preferably in the ranges A, C, and E. However, the grinding direction of the grindstone 4 in at least half or more regions of the main surface (that is, half or more of the grinding marks) may be in the ranges A, C, and E. The arithmetic average height (Sa) depends on the grit of the grindstone 4, and in the grinding using the grindstone 4 having a grit from #1000 to #5000, the arithmetic average height (Sa) is 0.1 μm or more in the ranges A, C, and E.

In the present disclosure, the arithmetic average height Sa in the range A is larger than that in the other ranges. In the range A, the surface state of the machined surface is particularly uniform as compared with the other ranges (see FIG. 8). Therefore, the grinding is particularly preferably performed so that the grinding direction of the grindstone 4 is within the range A.

Referring back to FIG. 1, after the surface grinding step S3 is completed, the single crystal 1 whose main surface is ground is sent to a chemical mechanical polishing (CMP) step S4. CMP is a process for polishing (mirror-polishing) a surface and eliminating fine distortions and the like in the surface, and can be performed using, for example, a slurry obtained by dispersing abrasive grains such as colloidal silica in an acidic solution or an alkaline solution.

After a CMP step S4 is completed, the obtained single crystal is sent to a cleaning step S5. In the cleaning step S5, the obtained single crystal is cleaned by using an acidic cleaning liquid, an alkaline cleaning liquid, functional water, ultrapure water, or the like and dried to obtain a gallium nitride single-crystal substrate. The obtained gallium nitride single-crystal substrate has semiconductor characteristics such as a wide band gap and a high electric breakdown field. Therefore, the obtained gallium nitride single-crystal substrate is suitably used for light-emitting devices such as light-emitting diodes and laser diodes, electronic devices having a high frequency and high output, short-wavelength lasers, next-generation power devices, and the like.

Figure 9:
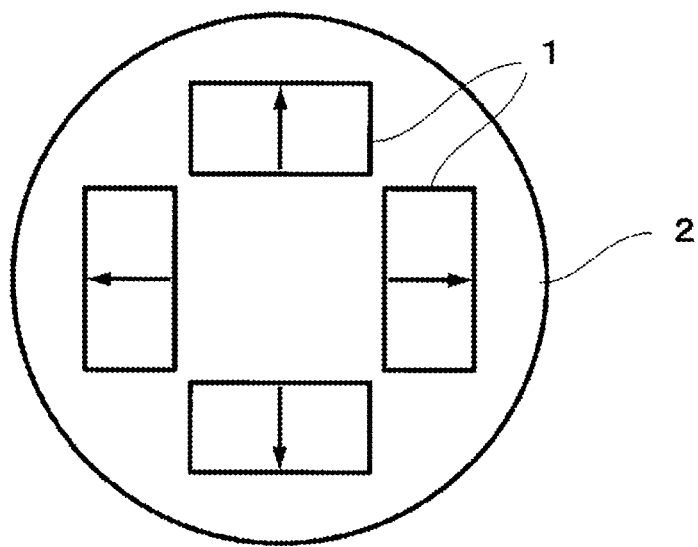
FIG. 9 is an explanatory view illustrating another attached state of a plurality of gallium nitride single crystals.

Note that, in the example illustrated in FIG. 5, a case is described in which a plurality of the gallium nitride single crystals 1 each having a semipolar plane are attached to the surface of the single-crystal holder 2 such that the directions (directions indicated by arrows) obtained by projecting the direction of each of the gallium nitride single crystals 1 onto the main surface are aligned. As illustrated in FIG. 9, in order to efficiently produce the single crystal 1 having a so-called satin finish, a plurality of the gallium nitride single crystals 1 are preferably arranged in the circumferential direction of the single-crystal holder 2 and the plurality of gallium nitride single crystals 1 are preferably attached to the surface of the single-crystal holder 2 so that the above-described arrows are directed outward in the radial direction of the single-crystal holder 2.

Figure 10:
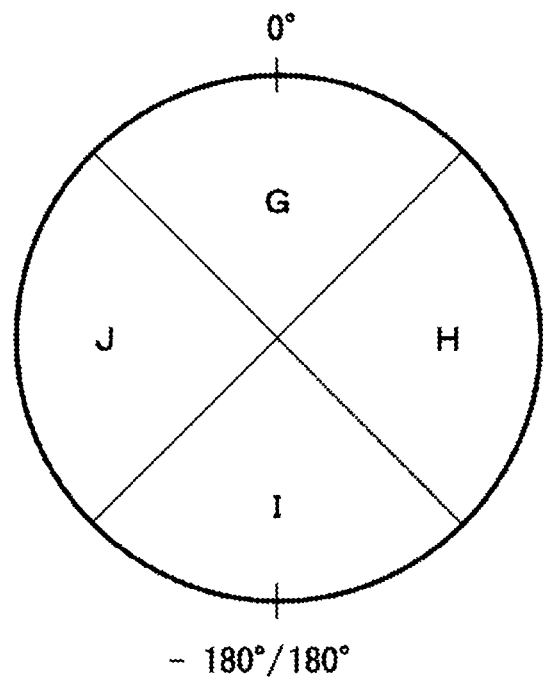
FIG. 10 is an explanatory view illustrating ranges G to J to be ground in the surface grinding step.

In the description above, a case of using the gallium nitride single crystal 1 having a semipolar plane as a main surface is mainly described. However, in a case where the gallium nitride single crystal 1 has a nonpolar plane as the main surface, in the grinding of the main surface of the gallium nitride single crystal 1, the main surface of the gallium nitride single crystal 1 is preferably held so that the direction in which the grindstone 4 grinds the main surface of the gallium nitride single crystal 1 is within one or both of the following ranges G and I illustrated in FIG. 10, or within one or both of the following ranges H and J.

Range G: −45° or more and 45° or less

Range H: 45° or more and 135° or less

Range I: 135° or more and 180° or less and −180° or more and −135° or less

Range J: −135° or more and −45° or less (where the angle is formed by a direction obtained by projecting a [000-1] direction of the gallium nitride single crystal onto the main surface, and a direction in which the grindstone grinds the main surface; an upstream side of the substrate in a rotation direction being from 0° to 180°; and a downstream side being from 0° to −180°)

The surface roughness (the arithmetic average height Sa) for each range of each of the gallium nitride single crystals 1 after grinding the main surfaces (front and back surfaces) was determined. The results are shown in Table 2. Note that specific machining conditions used to obtain the arithmetic average height Sa are the same as or similar to the machining conditions in Table 1 described above.

TABLE 2

| | Range of angles | Arithmetic average height Sa (nm) | |
|---|---|---|---|
| | | Front surface | Back surface |
| G | −45° or more and 45° or less | 296 | 273 |
| H | More than 45° and less than 135° | 156 | 173 |
| I | 135° or more and 180° or less and −180° or more and −135° or less | 284 | 286 |
| J | More than −135° and less than −45° | 173 | 167 |

It can be seen from Table 2 that, in the gallium nitride single crystal 1 having a nonpolar plane as a main surface, the machining characteristics between the front surface and the back surface are negligibly different in the ranges G, H, I, and J. In the gallium nitride single crystal 1 having a nonpolar plane as a main surface, the differences in machining characteristics between the front surface and the back surface observed in the gallium nitride single crystal 1 having a semipolar plane as a main surface are not observed. Even if the main surface is a semipolar plane, as long as the inclination from the nonpolar plane is small (for example, less than 2°), the differences in machining characteristics between the front surface and the back surface are small. Therefore, the present embodiment is also applicable to the gallium nitride single crystal 1 in which the orientation of the main surface is inclined from the nonpolar plane toward the c-plane by less than 2°.

The grindstone 4 and the single crystal 1 including a nitride of an element of group 13 in the periodic table and having a semipolar plane or a nonpolar plane as a main surface may be arranged to face each other. The main surface may be ground by pressing the single crystal 1 and the grindstone 4 against each other, while relatively moving the grindstone 4 in a direction substantially the same as the direction obtained by projecting the [000-1] direction of the single crystal 1 onto the main surface (that is, a direction directed from the range A to the range D illustrated in FIG. 7). In gallium nitride, the range A forms an angle of 0°±45° with the [000-1] projection direction. Depending on the material (composition) of the nitride of the element of group 13 in the periodic table, the angles forming the boundaries of each range are expected to vary somewhat, but the angles are presumed to be the same as or similar to those of gallium nitride. The grinding apparatus illustrated in FIGS. 3 and 4 may be used as the grinding apparatus. Alternatively, a surface grinding apparatus in which the single crystal 1 and the grindstone 4 reciprocate relative to each other may be used. In this case, a distance between the single crystal 1 and the grindstone 4 may be reduced (the grindstone 4 may be moved toward the single crystal 1) when the grindstone 4 moves in one direction from the range A to the range D while the grindstone 4 relatively reciprocates in a direction from the range A to the range D.

Above, a case of grinding the main surface on the [000-1] direction side is described. However, in a case of grinding the main surface on the [0001] direction side, the same or similar machining results are obtained by arranging the [0001] direction of the gallium nitride single crystal 1 so that a direction projected on the main surface (the direction of the arrow) is opposite to the direction of the arrows illustrated in FIG. 5, and setting the grinding direction of the grindstone to substantially the same direction as the direction obtained by projecting the direction.

According to the present disclosure, instead of the surface grinding step described above, a step of grinding the main surface may be adopted. In this step, the grindstone 4 and the single crystal 1 including a nitride of an element of group 13 in the periodic table and having a semipolar plane or a nonpolar plane as a main surface are arranged to face each other. Then, the single crystal 1 and the grindstone 4 are pressed against each other, while being reciprocated relative to each other in a direction substantially orthogonal to a direction obtained by projecting the [000-1] direction of the single crystal 1 onto the main surface (that is, a direction connecting the range C and the range E illustrated in FIG. 7). While grinding the single crystal 1 by reciprocating the grindstone 4, for example, when the grindstone 4 is reciprocated in a direction connecting the range A and the range D, the grindability when machining in a direction from the range A to the range D is markedly different from the grindability when machining in a direction from the range D to the range A. Therefore, the setting of appropriate machining conditions is difficult and a uniform machined surface is not easily obtained. On the other hand, when the grindstone 4 is reciprocated in the direction connecting the range C and the range E, the grindability when machining in a direction from the range C to the range E is not different from the grindability when machining in a direction from the range E to the range C. Therefore, appropriate machining conditions can be easily set and a uniform machined surface can be easily obtained. In gallium nitride, the angles formed by the range C and the range E with the direction M obtained by projecting the [000-1] direction are from 55° to 135° and from −55° to −135°. Depending on the material (composition) of the nitride of the element of group 13 in the periodic table, the angles forming the boundaries of each range are expected to vary somewhat, but the angles are presumed to be the same as or similar to those of gallium nitride. For example, a surface grinding apparatus in which the single crystal 1 and the grindstone 4 reciprocate relative to each other may be used as the grinding apparatus, and the single crystal 1 may be ground while relatively reciprocating the grindstone 4 in the direction connecting the range C and the range E.

In addition to the above-described gallium nitride, for example, aluminum nitride, indium nitride, or a mixed crystal thereof can be used as the nitride of the element of group 13 in the periodic table. Other configurations are the same as those in the embodiment described above.

An embodiment of the present disclosure has been described above. However, the present disclosure is not limited to the above embodiment and various changes and improvements can be made within the scope of the present disclosure.

REFERENCE SIGNS

1 Gallium nitride single crystal (single crystal)
2 Single-crystal holder
3 Chuck table
4 Grindstone
5 Grindstone holder
6 Spindle

The invention claimed is:

1. A method of manufacturing a gallium nitride single-crystal substrate, the method comprising:
grinding a main surface by arranging a single-crystal holder holding a gallium nitride single crystal having a semipolar plane as the main surface and a grindstone holder holding a grindstone to face each other, and pressing the gallium nitride single crystal and the grindstone against each other while rotating one or both of the gallium nitride single crystal and the grindstone, wherein
the main surface is ground to make an angle formed by a direction in which the grindstone grinds the main surface and a direction obtained by projecting a c-axis of the gallium nitride single crystal onto the main surface, to be within at least one range selected from the group consisting of ranges A, C, and E,
where range A is −45° or more and 45° or less,
range C is 55° or more and 135° or less,
range E is −135° or more and −55° or less,
where the angle is formed by a direction in which the grindstone grinds the main surface, and a direction obtained by projecting a [0001] direction of the gallium nitride single crystal onto the main surface when the main surface is a surface on a [0001] direction side, or a direction obtained by projecting a [000-1] direction of the gallium nitride single crystal onto the main surface when the main surface is a surface on a [000-1] direction side, and
an upstream side of the substrate in a rotation direction is from 0° to 180°; and a downstream side is from 0° to −180°.

2. The method of manufacturing a gallium nitride single-crystal substrate according to claim 1, wherein the gallium nitride single crystal is held and ground to make the angle be within the range A.

3. The method of manufacturing a gallium nitride single-crystal substrate according to claim 1, wherein an orientation of the main surface is inclined at more than 0° and 45° or less from a nonpolar plane toward a c-plane.

4. The method of manufacturing a gallium nitride single-crystal substrate according to claim 1, wherein the grindstone has a rectangular shape, and the grindstone comprises a plurality of grindstones arranged in a circumferential direction of the grindstone holder.

5. The method of manufacturing a gallium nitride single-crystal substrate according to claim 1, wherein abrasive grains of the grindstone have a grit from #1000 to #5000.

6. The method of manufacturing a gallium nitride single-crystal substrate according to claim 1, wherein a surface of the single-crystal holder to which the gallium nitride single crystal is fixed is inclined with a center portion as a vertex.

7. The method of manufacturing a gallium nitride single-crystal substrate according to claim 1, wherein the main surface of the single crystal ground by the grindstone within the range has an arithmetic average height (Sa) of 0.2 μm or more.

8. A method of manufacturing a single-crystal substrate of a nitride of an element of group 13 in the periodic table, comprising:
arranging a single crystal of a nitride of an element of group 13 in the periodic table, the single crystal having a semipolar plane or a nonpolar plane as a main surface, such that the main surface of the single crystal faces a surface of a grindstone; and
pressing the main surface of the single crystal and the surface of the grindstone against each other while reciprocating the single crystal and the grindstone relative to each other in a direction substantially orthogonal to a direction obtained by projecting a [000-1] direction of the single crystal onto the main surface to grind the single crystal such that the main surface after grinding is parallel to the main surface before grinding.

9. The method of manufacturing a single-crystal substrate of a nitride of an element of group 13 in the periodic table according to claim 8, wherein the main surface of the single crystal ground by the grindstone within the range has an arithmetic average height (Sa) of 0.1 μm or more.

10. The method of manufacturing a single-crystal substrate of a nitride of an element of group 13 in the periodic table according to claim 8, wherein
    the single-crystal substrate is a gallium nitride single-crystal substrate,
    the direction substantially orthogonal to a direction obtained by projecting a [000-1] direction of the single crystal onto the main surface is a direction connecting range C and range E,
    an angle formed by the range C with the direction obtained by projecting the [000-1] direction is 55° to 135°, and
    an angle formed by the range E with the direction obtained by projecting the [000-1] direction is −135° to −55°.

11. A method of manufacturing a single-crystal substrate of a nitride of an element of group 13 in the periodic table, comprising:
    arranging a surface of a grindstone and a single crystal of a nitride of an element of group 13 in the periodic table having a semipolar plane as a main surface to face each other;
    pressing the surface of the grindstone and the main surface of the single crystal against each other while moving the grindstone in a direction substantially identical to a direction obtained by projecting a [0001] direction of the single crystal onto the main surface when the main surface is a surface on a [0001] direction side, or in a direction substantially identical to a direction obtained by projecting a [000-1] direction of the single crystal onto the main surface when the main surface is a surface on a [000-1] direction side to grind the single crystal such that the main surface after grinding is parallel to the main surface before grinding.

12. The method of manufacturing a single-crystal substrate of a nitride of an element of group 13 in the periodic table according to claim 9, wherein
    the single-crystal substrate is a gallium nitride single-crystal substrate,
    the direction substantially identical to a direction obtained by projecting a [0001] direction of the single crystal onto the main surface is a direction moving from range D to range A,
    the direction substantially identical to a direction obtained by projecting a [000-1] direction of the single crystal onto the main surface is a direction moving from range A to the range D,
    an angle formed by the range A with the direction obtained by projecting the [000-1] direction onto the main surface is −45° to 45°, and
    an angle formed by the range D with the direction obtained by projecting the [000-1] direction onto the main surface is more than −135° and 180° or less and −180° or more and less than −135°.

13. A method of manufacturing a gallium nitride single-crystal substrate, the method comprising:
    grinding a main surface by arranging a single-crystal holder holding a gallium nitride single crystal having a nonpolar plane as the main surface and a grindstone holder holding a grindstone to face each other, and
    pressing the gallium nitride single crystal and the grindstone against each other while rotating one or both of the gallium nitride single crystal and the grindstone, wherein
    the gallium nitride single crystal is held and ground to make a direction in which the grindstone grinds the main surface to be within one or both of ranges G and I below, or within one or both of ranges H and J,
    where range G is −45° or more and 45° or less,
    range H is more than 45° and less than 135°,
    range I is 135° or more and 180° or less and −180° or more and −135° or less, and
    range J is more than −135° and less than −45°, and
    where the angle is formed by a direction obtained by projecting a [000-1] direction of the gallium nitride single crystal onto the main surface, and a direction in which the grindstone grinds the main surface;
    an upstream side of the substrate in a rotation direction is from 0° to 180°; and
    a downstream side is from 0° to −180°.

* * * * *